United States Patent
Morita

(10) Patent No.: US 8,767,894 B2
(45) Date of Patent: Jul. 1, 2014

(54) WIRELESS DEVICE AND RECEIVING METHOD

(75) Inventor: Tadashi Morita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/817,491

(22) PCT Filed: Feb. 22, 2012

(86) PCT No.: PCT/JP2012/001197
§ 371 (c)(1),
(2), (4) Date: Feb. 18, 2013

(87) PCT Pub. No.: WO2012/120804
PCT Pub. Date: Sep. 13, 2012

(65) Prior Publication Data
US 2013/0142294 A1    Jun. 6, 2013

(30) Foreign Application Priority Data

Mar. 7, 2011  (JP) .................................. 2011-048965

(51) Int. Cl.
*H04L 27/08*    (2006.01)

(52) U.S. Cl.
USPC ........................................................ 375/345

(58) Field of Classification Search
USPC .................. 375/316; 455/232.1, 234.1, 245.1, 455/250.1
See application file for complete search history.

(56) References Cited

U.S. PATENT DOCUMENTS

| 5,513,222 A * | 4/1996 | Iwasaki .......................... 375/347 |
| 6,563,383 B1 * | 5/2003 | Otaka et al. .................... 330/254 |
| 7,057,426 B2 * | 6/2006 | Yamaji et al. .................. 327/113 |
| 7,065,164 B1 * | 6/2006 | Sakima .......................... 375/345 |
| 2005/0221778 A1 | 10/2005 | Ishihara |
| 2009/0075614 A1 * | 3/2009 | Lin et al. ...................... 455/240.1 |
| 2009/0163153 A1 | 6/2009 | Senda et al. |
| 2012/0319775 A1 * | 12/2012 | Nakamura ..................... 330/129 |

FOREIGN PATENT DOCUMENTS

| CN | 1283006 A | 2/2001 |
| CN | 1677850 A | 10/2005 |
| CN | 101248599 A | 8/2008 |
| EP | 1065786 A2 | 1/2001 |
| JP | 2001-16638 A | 1/2001 |
| JP | 2005-286806 A | 10/2005 |

(Continued)

OTHER PUBLICATIONS

International Search Report for Application No. PCT/JP2012/001197 dated May 1, 2012.

*Primary Examiner* — Khanh C Tran
(74) *Attorney, Agent, or Firm* — Pearne & Gordon LLP

(57) ABSTRACT

The purpose of the present invention is to shorten a time required to perform Auto Gain Control (AGC) processing in a wireless device that can be applied to a plurality of wireless systems. On the basis of a first gain adjusted by means of a gain control unit (450-1), an initial gain setting unit (460) sets, for a variable gain unit (432-2), an initial gain (converted second initial gain) at the start of gain adjustment. Then, a gain control unit (450-2) sets the initial gain to a second gain at the time of starting the gain adjustment, and adjusts the second gain on the basis of IQ signals of a system, the IQ signals having the level adjusted by means of the variable gain unit (432-2).

12 Claims, 14 Drawing Sheets

(56) References Cited

FOREIGN PATENT DOCUMENTS

| JP | 2006-109154 A | 4/2006 |
| JP | 2007-67583 A | 3/2007 |
| JP | 2007-267304 A | 10/2007 |
| JP | 2007-281890 A | 10/2007 |
| JP | 2008-177869 A | 7/2008 |

* cited by examiner

| FIRST GAIN | SECOND GAIN |
|---|---|
| 8dB | 4dB |
| 18dB | 12dB |
| 28dB | 20dB |
| 38dB | 28dB |

FIG. 8

| DIFFERENCE PA (DIFFERENCE BETWEEN TRANSMITTED POWER AND RECEIVED POWER OF A SYSTEM) | DIFFERENCE PB (DIFFERENCE BETWEEN TRANSMITTED POWER AND RECEIVED POWER OF B SYSTEM) |
|---|---|
| 60dB | 68dB |
| 50dB | 56dB |
| 40dB | 44dB |
| 30dB | 32dB |

FIG. 13

| DIFFERENCE PA (DIFFERENCE BETWEEN TRANSMITTED POWER AND RECEIVED POWER OF A SYSTEM) | SECOND GAIN |
| --- | --- |
| 30dB | 4dB |
| 40dB | 12dB |
| 50dB | 20dB |
| 60dB | 28dB |

FIG. 14

WIRELESS DEVICE AND RECEIVING METHOD

TECHNICAL FIELD

The present invention relates to a wireless device capable of multiple wireless schemes, and a reception method.

BACKGROUND ART

As performance of recent wireless devices increases, wireless devices capable of multiple wireless schemes have emerged. This is partly because increased performance of high-frequency parts or the like has enabled high-frequency circuits to be partly shared by multiple different frequency systems and such systems may thereby be created with few additional components. Such multiple wireless schemes implemented in one wireless device are expected to cooperate to create new added value. For example, studies are in progress to create wireless devices capable of cellular communication such as W-CDMA (Wideband Code Division Multiple Access), and wireless LAN (Local Area Network) communication. Conventional wireless devices are adapted to the multiple wireless schemes by implementing independent processing sections corresponding to the multiple wireless schemes. The conventional wireless devices, for example, are provided with an independent processing section that performs synchronization processes such as AGC (Auto Gain Control), AFC (Auto Frequency Control), and timing synchronization during a preamble period, for each wireless scheme.

The wireless devices capable of the multiple wireless schemes, however, consume higher power due to the implementation of the independent processing section corresponding to each of the multiple wireless schemes.

PTL 1 discloses a technique for fast AFC process while maintaining low power consumption in a wireless device capable of multiple wireless schemes, in order to solve this problem.

CITATION LIST

Patent Literature

PTL 1
Japanese Patent Application Laid-Open No. 2007-267304

SUMMARY OF INVENTION

Technical Problem

Time required for the AGC process generally accounts for the largest percentage of time required for the respective synchronization processes in the preamble period. In addition, the AFC and establishment of the synchronization cannot be performed unless the AGC is completed. Accordingly, quick completion of the AGC process in the wireless device can increase time available for the AFC process, the timing synchronization process and the like, thereby improving overall communication performance.

A technique for reducing the time required for the AGC process in the conventional wireless devices capable of the multiple wireless schemes, however, has not been sufficiently studied.

An object of the present invention is to provide a wireless device that is capable of the multiple wireless schemes and can reduce the time required for the AGC process, and a reception method thereof.

Solution to Problem

To achieve the abovementioned object, a wireless device reflecting one aspect of the present invention includes a first antenna that receives a first signal modulated by a first wireless scheme; a second antenna that receives a second signal modulated by a second wireless scheme; a first variable gain section that adjusts a level of the first signal; a second variable gain section that adjusts a level of the second signal; a first gain control section that adjusts a first gain based on the first signal whose level has been adjusted by the first variable gain section, the first gain being a gain of the first variable gain section; a setting section that sets an initial gain based on the first signal, the initial gain being a second gain that is a gain of the second variable gain section, the initial gain being used by the second variable gain section at start of gain adjustment; and a second gain control section that sets the initial gain to the second gain at the start of the gain adjustment, and adjusts the second gain based on the second signal whose level has been adjusted by the second variable gain section.

To achieve the abovementioned object, a reception method reflecting one aspect of the present invention includes a first receiving step of receiving a first signal modulated by a first wireless scheme; a second receiving step of receiving a second signal modulated by a second wireless scheme; a first adjustment step of adjusting a level of the first signal; a second adjustment step of adjusting a level of the second signal; a first gain control step of adjusting a first gain based on the first signal whose level has been adjusted by the first adjustment step, the first gain being a gain in the first adjustment step; a setting step of setting an initial gain based on the first signal, the initial gain being a second gain that is a gain in the second adjustment step, the initial gain being used by the second adjustment step at start of gain adjustment; and a second gain control step of setting the initial gain to the second gain at the start of the gain adjustment, and adjusting the second gain based on the second signal whose level has been adjusted by the second adjustment step.

Advantageous Effects of Invention

According to the present invention, the wireless device capable of the multiple wireless schemes can reduce the time required for the AGC process.

BRIEF DESCRIPTION OF DRAWINGS

FIG. 8 is a diagram illustrating an example of a table stored in an initial gain setting section according to Embodiment 1;

FIG. 13 is a diagram illustrating an example of the table stored in the initial gain setting section according to Embodiment 2; and FIG. 14 is a diagram illustrating another example of the table stored in the initial gain setting section according to Embodiment 2.

DESCRIPTION OF EMBODIMENTS

Embodiments of the present invention will be described in detail below with reference to the drawings.

(Embodiment 1)

Figure 1:
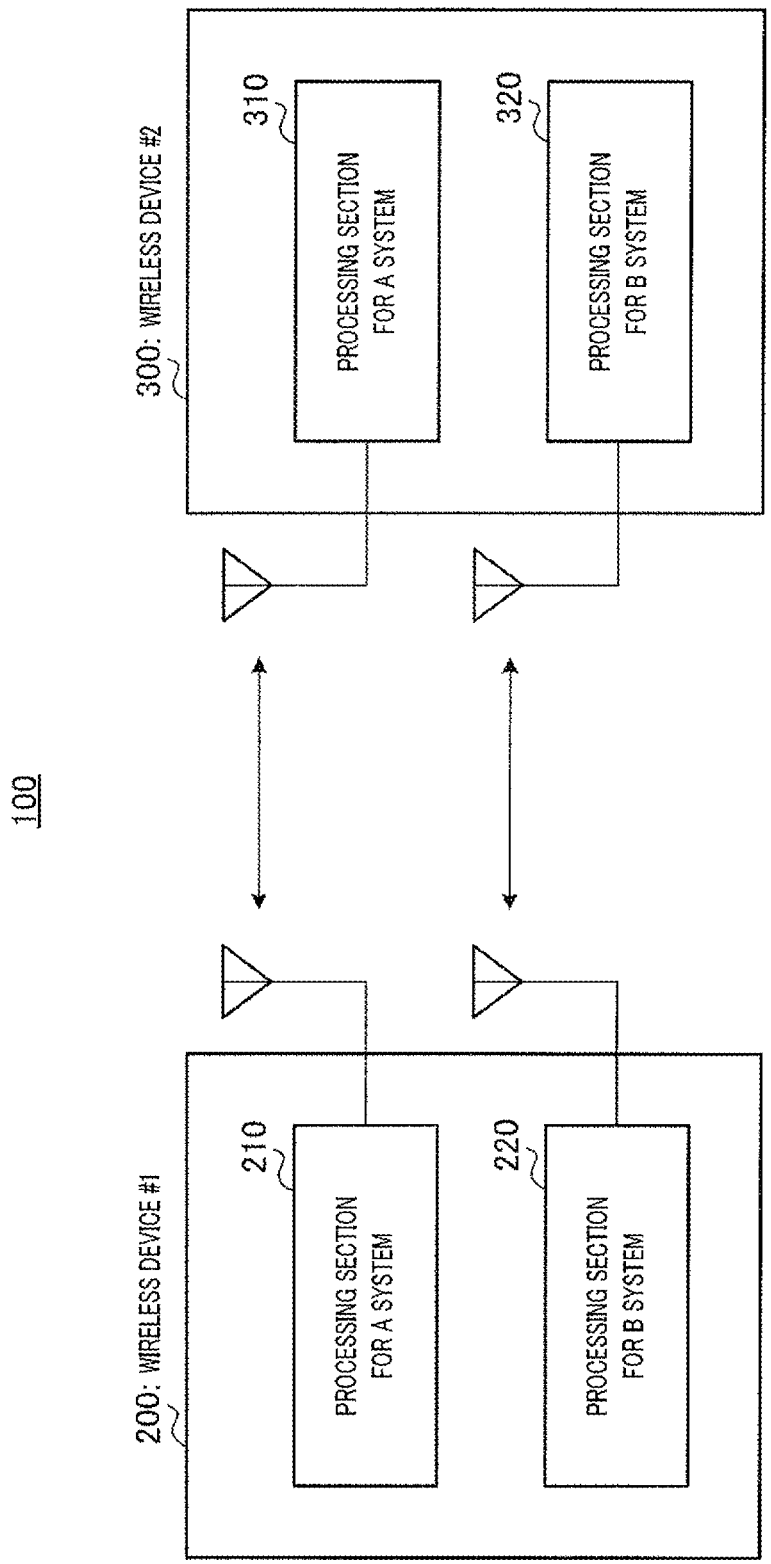
FIG. 1 is a diagram illustrating a configuration example of a wireless system according to Embodiment 1 of the present invention.

FIG. 1 is a diagram illustrating a configuration example of a wireless system according to Embodiment 1 of the present invention. Wireless system 100 of FIG. 1 includes wireless device #1 200 and wireless device #2 300. The case will be described below where wireless device #1 200 and wireless device #2 300 are capable of two wireless communication systems, an "A system" and a "B system," by way of example. The two wireless systems, for example, correspond to different wireless standards like a cellular communication system such as W-CDMA, and a wireless LAN communication system.

Wireless device #1 200 includes processing section for the "A system" 210 and processing section for the "B system" 220. Wireless device #2 300 includes processing section for the "A system" 310 and processing section for the "B system" 320.

Processing sections 210 and 310 for the "A system" perform transmission and reception processes for the "A system". Processing sections 220 and 320 for the "B system" perform transmission and reception processes for the "B system".

The case will be described below where wireless device #1 200 receives signals of the A and B systems that are transmitted from wireless device #2 300. Communication of the "B system" may or may not be performed simultaneously with communication of the "A system". Hereinafter, the communication of the "A system" is assumed to have been performed prior to the communication of the "B system".

Wireless device #1 200 knows in advance that it receives the signal transmitted from wireless device #2 300, next in the communication of the "B system". Wireless device #1 200 has obtained this information through previous arrangements made between wireless device #1 200 and wireless device #2 300, statistics of past communication, or information shared among members in the communication.

Figure 2:
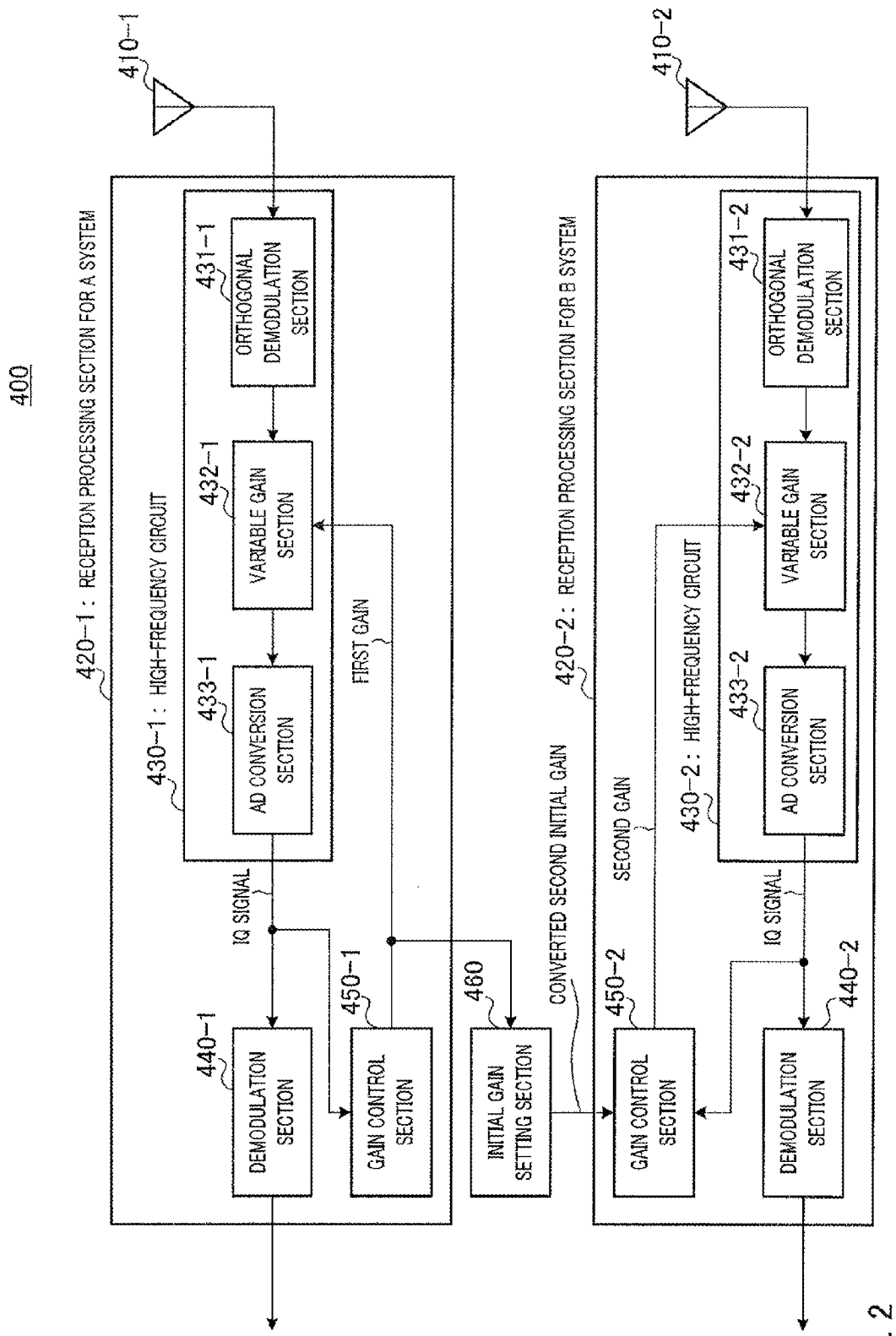
FIG. 2 is a block diagram illustrating the configuration of a wireless device according to Embodiment 1.

FIG. 2 is a block diagram illustrating the configuration of the wireless device according to the present embodiment. Wireless device 400 of FIG. 2 is applied to wireless device #1 (200) of FIG. 1. In order to avoid complicated descriptions, FIG. 2 illustrates only components associated with the reception of the signals of the A and B systems, which is closely related to the present invention. FIG. 2 omits illustrations and descriptions of components associated with the transmission of the signals of the A and B systems.

Wireless device 400 includes antennas 410-1 and 410-2, reception processing section 420-1 for the "A system", reception processing section 420-2 for the "B system," and initial gain setting section 460.

Antenna 410-1 receives the signal of the "A system".

Antenna 410-2 receives the signal of the "B system".

Reception processing section for the "A system" 420-1 includes high-frequency circuit 430-1, demodulation section 440-1 and gain control section 450-1.

High-frequency circuit 430-1 includes orthogonal demodulation section 431-1, variable gain section 432-1 and AD (Analog to Digital) conversion section 433-1.

Orthogonal demodulation section 431-1 performs an orthogonal demodulation process on the signal of the "A system" received via antenna 410-1, and generates a baseband IQ signal of the "A system". Orthogonal demodulation section 431-1 outputs the baseband IQ signal of the "A system" to variable gain section 432-1.

Variable gain section 432-1 adjusts the level of the baseband IQ signal of the "A system". Specifically, variable gain section 432-1 adjusts the level of the baseband IQ signal of the "A system" based on a gain designated by gain control section 450-1 (hereinafter referred to as "first gain"). Variable gain section 432-1 outputs the baseband IQ signal of the "A system" after the level adjustment, to AD conversion section 433-1.

AD conversion section 433-1 converts the analog baseband IQ signal of the "A system" after the level adjustment, into a digital signal. AD conversion section 433-1 outputs the digital IQ signal of the "A system" after the conversion, to demodulation section 440-1 and gain control section 450-1.

Demodulation section 440-1 demodulates the digital IQ signal of the "A system".

Gain control section 450-1 adjusts the gain of variable gain section 432-1 (the first gain) while monitoring the power of the digital IQ signal of the "A system". Specifically, gain control section 450-1 sets the first gain such that the power of the digital IQ signal of the "A system" remains constant. The internal configuration and operations of gain control section 450-1 will be described later.

Reception processing section 420-1 for the "A system" thus uses the output of variable gain section 432-1 to perform an AGC process in which gain control section 450-1 adjusts the gain of variable gain section 432-1 (this is, the first gain).

Initial gain setting section 460 sets an initial gain to be used by variable gain section 432-2 at the start of the gain adjustment (hereinafter referred to as "converted second initial gain"), based on the first gain. A method of setting the converted second initial gain will be described later. Initial gain setting section 460 outputs information on the set converted second initial gain, to gain control section 450-2.

Reception processing section for the "B system" 420-2 includes high-frequency circuit 430-2, demodulation section 440-2 and gain control section 450-2.

High-frequency circuit 430-2 includes orthogonal demodulation section 431-2, variable gain section 432-2 and AD conversion section 433-2.

Orthogonal demodulation section 431-2 performs the orthogonal demodulation process on the signal of the "B system" received via antenna 410-2, and generates a baseband IQ signal of the "B system". Orthogonal demodulation section 431-2 outputs the baseband IQ signal of the "B system" to variable gain section 432-2.

Variable gain section 432-2 adjusts the level of the baseband IQ signal of the "B system". Specifically, variable gain section 432-2 adjusts the level of the baseband IQ signal of the "B system" based on a gain specified by gain control section 450-2 (hereinafter referred to as "second gain"). Variable gain section 432-2 outputs the baseband IQ signal of the "B system" after the level adjustment, to AD conversion section 433-2.

AD conversion section 433-2 converts the analog baseband IQ signal of the "B system" after the level adjustment, into a digital signal. AD conversion section 433-2 outputs the digital IQ signal of the "B system" after the conversion, to demodulation section 440-2 and gain control section 450-2.

Demodulation section 440-2 demodulates the digital IQ signal of the "B system".

Gain control section 450-2 adjusts the gain of variable gain section 432-2 (that is, the second gain) while monitoring the power of the digital IQ signal of the "B system". Specifically, gain control section 450-2 uses the converted second initial gain set by initial gain setting section 460, as the initial gain at the start of the gain adjustment. Gain control section 450-2 then sets the second gain such that the power of the digital IQ signal of the "B system" remains constant. The internal configuration and operations of gain control section 450-2 will be described later.

Reception processing section 420-2 for the "B system" thus uses the output of variable gain section 432-2 to perform the AGC process in which gain control section 450-2 adjusts the gain of variable gain section 432-2 (that is, the second gain).

Figure 3:
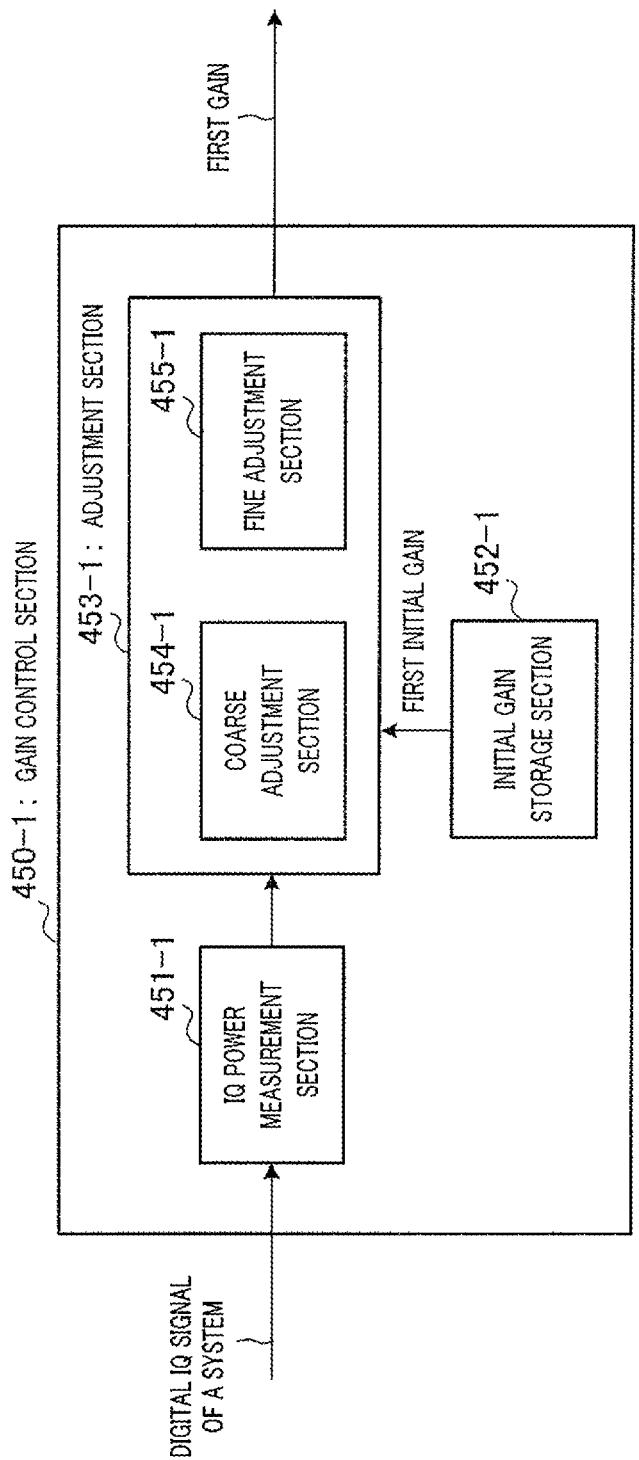
FIG. 3 is a diagram illustrating an example of the internal configuration of a gain control section in a reception processing section for an "A system" according to Embodiment 1.

FIG. 3 is a diagram illustrating an example of the internal configuration of gain control section 450-1 in reception processing section 420-1 for the "A system".

Gain control section 450-1 includes IQ power measurement section 451-1, initial gain storage section 452-1, and adjustment section 453-1, and adjusts the gain of variable gain section 432-1 (the first gain).

IQ power measurement section 451-1 measures a power value of the digital IQ signal of the "A system", and outputs the measured power value to adjustment section 453-1.

Initial gain storage section 452-1 stores an initial gain to be used by variable gain section 432-1 at the start of the gain adjustment (hereinafter referred to as "first initial gain"). Initial gain storage section 452-1 then outputs information on the first initial gain to adjustment section 453-1, at the start of the gain adjustment.

Adjustment section 453-1 adjusts the gain of variable gain section 432-1 (the first gain) based on the power value of the digital IQ signal of the "A system". Adjustment section 453-1 outputs the information on the first initial gain, as information on the first gain, to variable gain section 432-1 at the start of the gain adjustment.

Adjustment section 453-1 includes coarse adjustment section 454-1 and fine adjustment section 455-1.

Coarse adjustment section 454-1 coarsely adjusts the gain of variable gain section 432-1 based on the power value of the digital IQ signal of the "A system".

Fine adjustment section 455-1 finely adjusts the gain of variable gain section 432-1, within an adjustment range smaller than a gain adjustment range in coarse adjustment section 454-1.

Adjustment section 453-1 then sets the final first gain while adjusting the first gain in coarse adjustment section 454-1 and fine adjustment section 455-1. Adjustment section 453-1 outputs information on the set final first gain to initial gain setting section 460.

Figure 4:
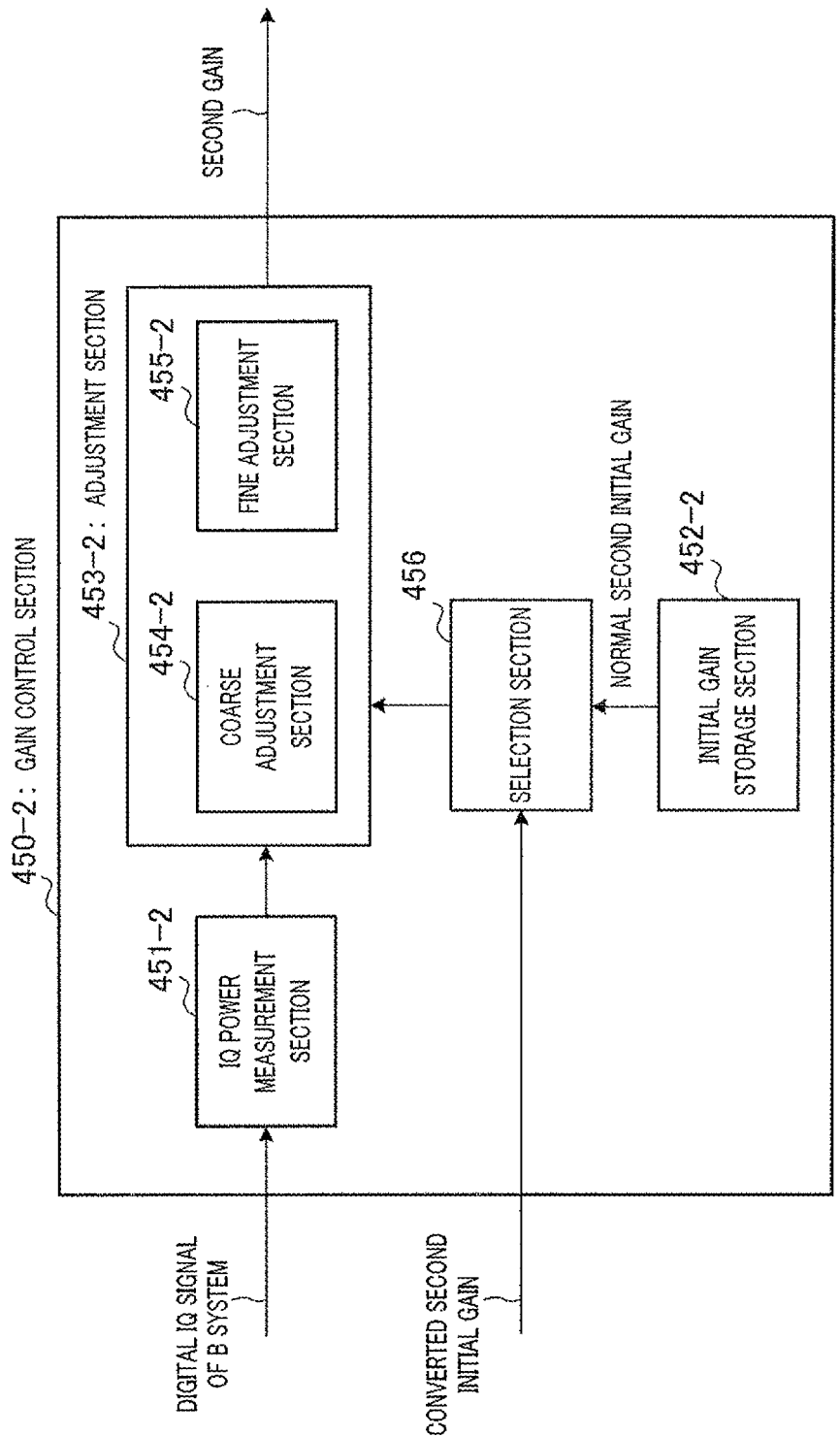
FIG. 4 is a diagram illustrating an example of the internal configuration of a gain control section in a reception processing section for a "B system" according to Embodiment 1.

FIG. 4 is a diagram illustrating an example of the internal configuration of gain control section 450-2 in reception processing section 420-2 for the "B system".

Gain control section 450-2 includes IQ power measurement section 451-2, initial gain storage section 452-2, adjustment section 453-2, and selection section 456, and adjusts the gain of variable gain section 432-2 (the second gain).

IQ power measurement section 451-2 measures a power value of the digital IQ signal of the "B system", and outputs the measured power value to adjustment section 453-2.

Initial gain storage section 452-2 stores an initial gain to be normally used by variable gain section 432-2 at the start of the gain adjustment (hereinafter referred to as "normal converted second initial gain"). Initial gain storage section 452-2 then outputs information on the normal converted second initial gain to selection section 456, at the start of the gain adjustment.

Information on a normal converted second initial gain is input to selection section 456 from initial gain storage section 452-2. In addition, the information on the converted second initial gain is input to selection section 456 from initial gain setting section 460. If the information on the converted second initial gain is input from initial gain setting section 460, selection section 456 outputs the information on the converted second initial gain, as information on a second initial gain, to adjustment section 453-2. In contrast, if the information on the converted second initial gain is not input from initial gain setting section 460, selection section 456 outputs the information on the normal converted second initial gain, as the information on the second initial gain, to adjustment section 453-2.

Adjustment section 453-2 adjusts the gain of variable gain section 432-2 based on the power value of the digital IQ signal of the "B system". The information on the second initial gain is input to adjustment section 453-2 from selection section 456. Adjustment section 453-2 outputs the information on the second initial gain, as information on the second gain, to variable gain section 432-2 at the start of the gain adjustment. Adjustment section 453-2 then adjusts the second gain based on the digital IQ signal of the "B system".

Adjustment section 453-2 includes coarse adjustment section 454-2 and fine adjustment section 455-2.

Coarse adjustment section 454-2 performs the coarse adjustment on the gain of variable gain section 432-2.

Fine adjustment section 455-2 performs the fine adjustment on the gain of variable gain section 432-2, within an adjustment range smaller than a gain adjustment range in coarse adjustment section 454-2.

Adjustment section 453-2 then sets the final second gain of variable gain section 432-2 while adjusting the second gain in coarse adjustment section 454-2 and fine adjustment section 455-2.

Operations of wireless device 400 will be described next.

Figure 5:
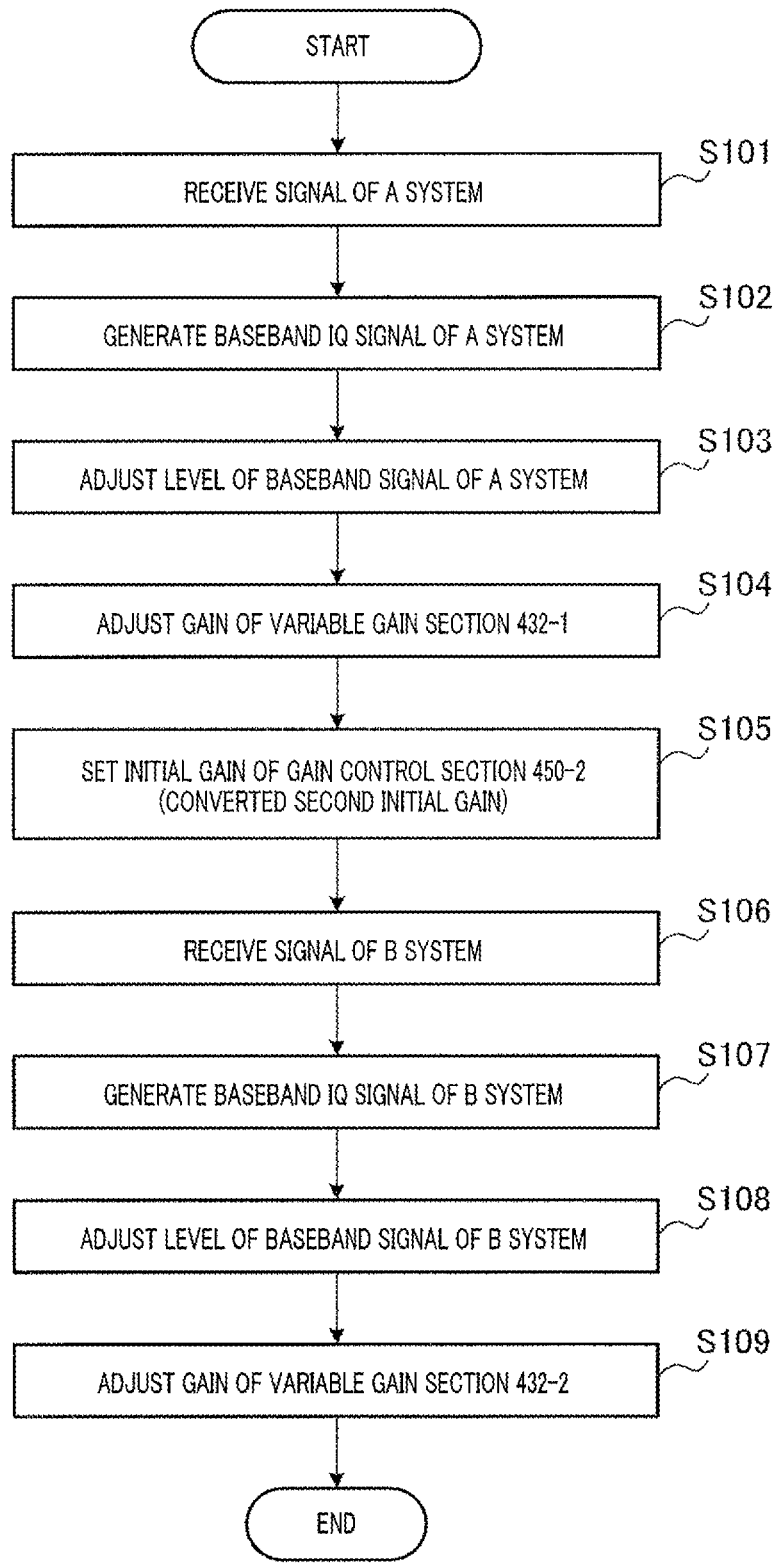
FIG. 5 is a flowchart illustrating an example of operations of the wireless device according to Embodiment 1.

FIG. 5 is a flowchart illustrating an example of the operations of wireless device 400.

In step S101, antenna 410-1 receives the signal of the "A system" transmitted from wireless device #2 300 (not illustrated).

In step S102, orthogonal demodulation section 431-1 performs the orthogonal demodulation process on the signal of the "A system", and generates the baseband IQ signal of the "A system".

In step S103, variable gain section 432-1 adjusts the level of the baseband IQ signal of the "A system".

In step S104, gain control section 450-1 then adjusts the gain of variable gain section 432-1 (that is, the first gain), based on the baseband IQ signal of the "A system" after the level adjustment.

In step S105, initial gain setting section 460 sets the initial gain of gain control section 450-2 (that is, the converted second initial gain), based on the gain of variable gain section 432-1 (that is, the first gain) set by gain control section 450-1. The method of setting the converted second initial gain will be described later.

In step S106, antenna 410-2 receives the signal of the "B system" transmitted from wireless device #2 300 (not illustrated).

In step S107, orthogonal demodulation section 431-2 performs the orthogonal demodulation process to generate the baseband IQ signal of the "B system".

In step S108, variable gain section 432-2 adjusts the level of the baseband IQ signal of the "B system".

In step S109, gain control section 450-2 then adjusts the gain of variable gain section 432-2 (the second gain), based on the baseband IQ signal of the "B system" after the level adjustment.

In FIG. 1, signals of the A and B systems leave wireless device #2 300, pass through the same propagation path, and arrive at wireless device #1 200. The reception levels of the signals of the A and B systems then decrease due to propagation losses. As described above, gain control section 450-1 adjusts the gain of variable gain section 432-1 (that is, the first gain) such that the power of the digital IQ signal of the "A system" that is input to demodulation section 440-1 remain constant. In other words, gain control section 450-1 adjusts the gain of variable gain section 432-1 (that is, the first gain) to be a value that compensates for the propagation loss of the signal of the "A system". Thus, the gain of variable gain section 432-1 (that is, the first gain), adjusted by gain control section 450-1, includes information on the propagation loss.

Accordingly, initial gain setting section 460 sets the gain to be used by variable gain section 432-2 (the converted second initial gain), based on the first gain, at the start of the gain adjustment. Gain control section 450-2 thereby starts the gain adjustment with the converted second initial gain suitable for compensating for the propagation loss, and thus reduces the time required for the gain adjustment in variable gain section 432-2. Wireless device 400 thereby increases the time to be assigned to establishment of timing synchronization and an AFC process in a preamble period, and improve communication performance.

The method of setting the converted second initial gain in initial gain setting section 460 will be described next.

The case of variable gain sections 432-1 and 432-2 including multiple VGAs (Variable Gain Amplifiers) will be considered below. In addition, the case of variable gain sections 432-1 and 432-2 having the same internal configuration will be described by way of example.

Figure 6:
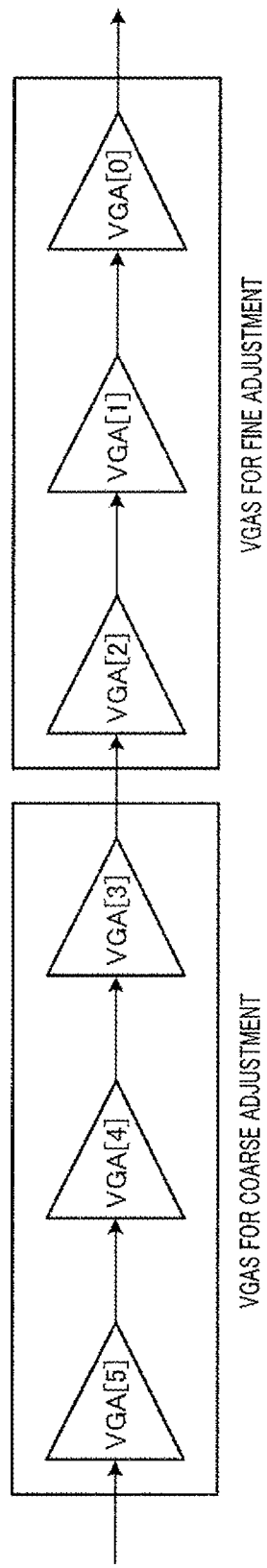
FIG. 6 is a block diagram illustrating an example of the configuration of variable gain sections in the reception processing sections for the A and B systems according to Embodiment 1.

FIG. 6 is a block diagram illustrating an example of the configuration of variable gain sections 432-1 and 432-2. Variable gain sections 432-1 and 432-2 of FIG. 6 include VGA[0] to VGA[5]. Among them, VGA[0] to VGA[2] are VGAs for the fine adjustment, while VGA[3] to VGA[5] are those for the coarse adjustment.

VGA[0] to VGA[5] switch between whether or not to amplify the input signal, depending on gain setting values C[0] to C[5]. If C[k]=1, for example, VGA[k] amplifies the amplitude level of the input signal by $2^k$ dB. In contrast, if C[k]=0, VGA[k] directly outputs the input signal without an amplification operation.

[Setting Method #1-1]

Initial gain setting section 460 directly sets the first gain to the converted second initial gain of variable gain section 432-2.

Gain control section 450-1, for example, is assumed to have set the gain setting values C[0] to C[5] of VGA[0] to VGA[5] in variable gain section 432-1 (the first gain) as follows:

C[5]=1, C[4]=0, C[3]=1, C[2]=0, C[1]=1, C[0]=0.

Initial gain setting section 460 then directly sets the above setting to the converted second initial gain of VGA[0] to VGA[5] included in variable gain section 432-2.

Gain control section 450-2 then starts the gain adjustment with the converted second initial gain to adjust the gain of variable gain section 432-2 (that is, the second gain) such that the amplitude level of the digital IQ signal of the "B system" remains constant.

In Setting Method #1-1, gain control section 460 thus directly sets the gain of variable gain section 432-1 (the first gain) that has already been adjusted by gain control section 450-1, to the converted second initial gain. Variable gain section 432-2 then uses the first gain of variable gain section 432-1, for the converted second initial gain, and performs the level adjustment. If frequencies of the A and B systems are close to each other and a difference between the propagation losses of the signals of the A and B systems is small, for example, gain control section 450-2 can complete the gain adjustment in a short time.

[Setting Method #1-2]

Initial gain setting section 460 sets an initial gain of coarse adjustment section 454-2 based on the first gain.

Gain control section 450-1, for example, is assumed to have set the gain setting values C[0] to C[5] of VGA[0] to VGA[5] in variable gain section 432-1 (the first gain) as follows:

C[5]=1, C[4]=0, C[3]=1, C[2]=0, C[1]=1, C[0]=0.

Initial gain setting section 460 then sets the converted second initial gain that has at least C[5]=1, C[4]=0 and C[3]=1, among the gain setting values C[0] to C[5] of VGA[0] to VGA[5] in variable gain section 432-2.

In Setting Method #1-2, variable gain section 432-2 thus uses the initial gain of the VGAs for the coarse adjustment in variable gain section 432-1, in the first gain, for the initial gain of the VGAs for the coarse adjustment in variable gain section 432-2, and performs the level adjustment. The first gain includes the information on the propagation loss as described above. Accordingly, for example, even if the A and B systems have different frequencies and propagation losses, gain control section 450-2 can start the gain adjustment with the converted second initial gain suitable for compensating for the propagation loss. Gain control section 450-2 can thereby reduce the time required for the gain adjustment.

Setting Methods #1-1 and #1-2 are preferred in the case of variable gain sections 432-1 and 432-2 having the same internal configuration.

Additionally, setting methods applicable in the case of variable gain sections 432-1 and 432-2 (that is, Setting Methods #1-3 and #1-4) have different internal configurations and will be described next.

FIG. 7 is a block diagram illustrating an example of the configurations of variable gain sections 432-1 and 432-2.

Figure 7A:
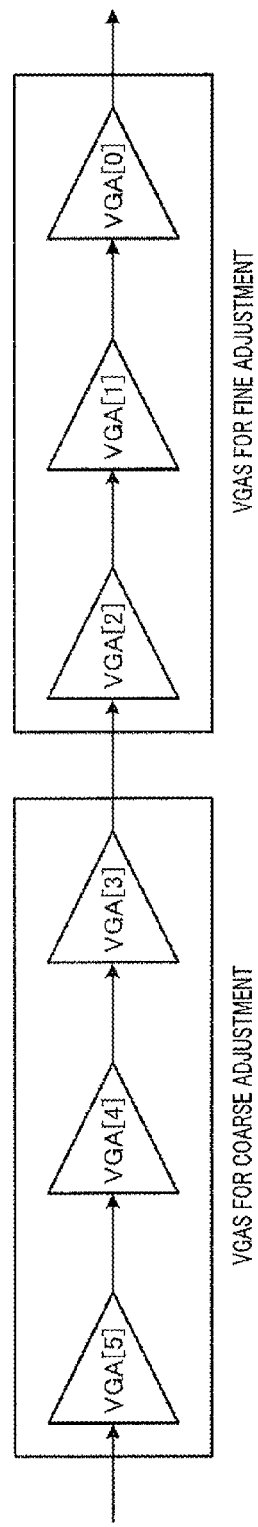
FIG. 7 is a block diagram illustrating an example of the configurations of the variable gain sections in the reception processing sections for the A and B systems according to Embodiment 1.

Variable gain section 432-1 of FIG. 7A includes VGA[0] to VGA[5]. Among them, VGA[0] to VGA[2] are the VGAs for the fine adjustment, while VGA[3] to VGA[5] are those for the coarse adjustment.

VGA[0] to VGA[5] switch between whether or not to amplify the input signal, depending on the gain setting values C[0] to C[5]. If C[k]=1, for example, VGA[k] amplifies the amplitude level of the input signal by $2^k$ dB. In contrast, if C[k]=0, VGA[k] directly outputs the input signal without the amplification operation.

Figure 7B:
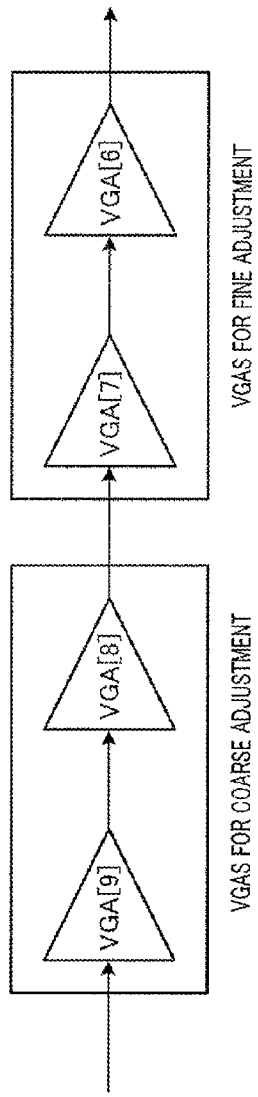

Variable gain section 432-2 of FIG. 7B includes VGA[6] to VGA[9]. Among them, VGA[6] and VGA[7] are the VGAs for the fine adjustment, while VGA[8] and VGA[9] are those for the coarse adjustment.

VGA[6] to VGA[9] switch between whether or not to amplify the input signal, depending on gain setting values C[6] to C[9]. If C[k]=1, for example, VGA[k] amplifies the amplitude level of the input signal by $3^k$ dB. In contrast, if C[k]=0, VGA[k] directly outputs the input signal without the amplification operation.

[Setting Method #1-3]

Initial gain setting section 460 compares the first gain with a predetermined range, and based on a result of the comparison, selects a candidate from a list of candidates for the converted second initial gain of variable gain section 432-2. Initial gain setting section 460 then sets the selected candidate to the converted second initial gain of variable gain section 432-2.

Specifically, initial gain setting section 460 compares the first gain with the predetermined range, and determines the electric field level of the propagation path. Initial gain setting section 460 then sets the converted second initial gain of variable gain section 432-2, depending on the determined electric field level.

Initial gain setting section 460, for example, compares the first gain with the eleventh range (from 0 dB to 20 dB), the twelfth range (from 21 dB to 42 dB), and the thirteenth range (from 43 dB to 63 dB). If the first gain is in the eleventh range (from 0 dB to 20 dB), in the twelfth range (from 21 dB to 42 dB), or in the thirteenth range (from 43 dB to 63 dB), the initial gain setting section 460 is assumed to determine the electric field level to be a strong electric field level, a medium electric field level, or a weak electric field level, respectively.

Gain control section 450-1 is assumed to have set the gain setting values C[0] to C[5] of VGA[0] to VGA[5] in variable gain section 432-1 (that is, the first gain) as follows:

C[5]=1, C[4]=0, C[3]=1, C[2]=0, C[1]=1, C[0]=0.

According to the above setting, the first gain of variable gain section 432-1 becomes 26(=32×1+16×0+8×1+4×0+2×1+1×0) dB.

Accordingly, initial gain setting section 460 determines that the electric field level of the propagation path is the medium electric field level, based on the result of the comparison between the first gain (=26 dB) and the above ranges.

After determining the electric field level from the first gain, initial gain setting section 460 then sets the converted second initial gain depending on a result of the determination.

It is assumed that, for example, there are three candidates G21, G22 and G23 in the list of candidates for the initial gain C[9:6] of coarse adjustment section 454-2. For example, G21 is assumed to be C[9]=0, C[8]=1, C[7]=0, C[6]=1. G22 is assumed to be C[9]=1, C[8]=0, C[7]=0, C[6]=0. G23 is assumed to be C[9]=1, C[8]=1, C[7]=0, C[6]=0.

In the case of the weak electric field level, initial gain setting section 460 sets the initial gain of coarse adjustment section 454-2 to G21. In the case of the medium electric field level, initial gain setting section 460 sets the initial gain of coarse adjustment section 454-2 to G22. In the case of the strong electric field level, initial gain setting section 460 sets the initial gain of coarse adjustment section 454-2 to G23.

In Setting Method #1-3, initial gain setting section 460 thus classifies the status of the propagation path into the strong electric field level, the medium electric field level, or the weak electric field level, based on the first gain. Initial gain setting section 460 then sets the initial gain of variable gain section 432-2 (the converted second initial gain), depending on the status of the propagation path. The first gain includes the information on the propagation loss as described above. Initial gain setting section 460 then determines the status of the propagation path depending on the first gain, and sets the converted second initial gain suitable for the status of the propagation path. Accordingly, even in the case of variable gain sections 432-1 and 432-2 having the different internal configurations, gain control section 450-2 can start the gain adjustment with the converted second initial gain suitable for compensating for the propagation loss. Gain control section 450-2 can thereby reduce the time required for the gain adjustment.

In the above description, initial gain setting section 460 classifies the electric field level into three classes depending on the first gain, and selects the candidate from the three candidates for the initial gain depending on the electric field level, which is not limited thereto. The number of classes into which the electric field level is classified, and the number of candidates for the converted second initial gain depend on requested precision of variable gain section 432-2.

In addition, in the above described case, initial gain setting section 460 sets only the initial gain of coarse adjustment section 454-2 depending on the electric field level, which is not limited thereto. Initial gain setting section 460 may set the initial gains of coarse adjustment section 454-2 and fine adjustment section 455-2, depending on the electric field level.

Setting Method #1-3 is also applicable to the case of variable gain sections 432-1 and 432-2 having the same internal configuration.

[Setting Method #1-4]

In Setting Method #1-4, initial gain setting section 460 stores a table that includes the first gain associated with the corresponding second gain, and sets the initial gain of variable gain section 432-2 (that is, the converted second initial gain) based on the first gain.

FIG. 8 is a diagram illustrating an example of the table stored in initial gain setting section 460. The first gain is associated with the corresponding second gain based on the effects of the propagation losses through the propagation path and due to the difference between the frequencies of the signals of the A and B systems. In other words, this table includes a first gain associated with a corresponding second gain that is obtained by applying a frequency characteristic conversion to the first gain and depending on the difference between the propagation losses of the signals of the A and B systems.

Initial gain setting section 460 then selects the second gain associated with the first gain from this table, and sets the selected second gain to the initial gain of variable gain section 432-2 (that is, the converted second initial gain).

In Setting Method #1-4, initial gain setting section 460 thus sets the gain obtained by applying the frequency characteristic conversion to the first gain, to the converted second initial gain, depending on the difference between the propagation losses of the signals of the A and B systems. Accordingly, even in the case of variable gain sections 432-1 and 432-2 having the different internal configurations, gain control section 450-2 can start the gain adjustment with the converted second initial gain suitable for compensating for the propagation loss. The time required for gain adjustment is thereby reduced. Setting Method #1-4 is also applicable to the case of variable gain sections 432-1 and 432-2 having the same internal configuration.

As described above, in wireless device 400 according to the present embodiment, initial gain setting section 460 sets the converted second initial gain based on the first gain. Here, the first gain is the gain of variable gain section 432-1 that has been adjusted by gain control section 450-1. The converted second initial gain is the initial gain of variable gain section 432-2 at the start of the gain adjustment.

Gain control section 450-2 then sets this converted second initial gain to the second gain at the start of the gain adjustment, and adjusts the second gain based on the IQ signal of the "B system" whose level has been adjusted by variable gain section 432-2. Wireless device 400 thereby starts the gain adjustment with the converted second initial gain suitable for compensating for the propagation loss and reduces the time required for the gain adjustment. In other words, wireless device 400 can reduce time required for the AGC process. Wireless device 400 therefore improves the communication performance by an increase in the time available for AFC processing and the timing synchronization process in the preamble period.

After the converted second initial gain is set, only fine adjustment section 455-2 may perform the gain adjustment, without coarse adjustment section 454-2. This reduces power consumption in subsequent gain adjustment without coarse adjustment section 454-2.

(Embodiment 2)

Figure 9:
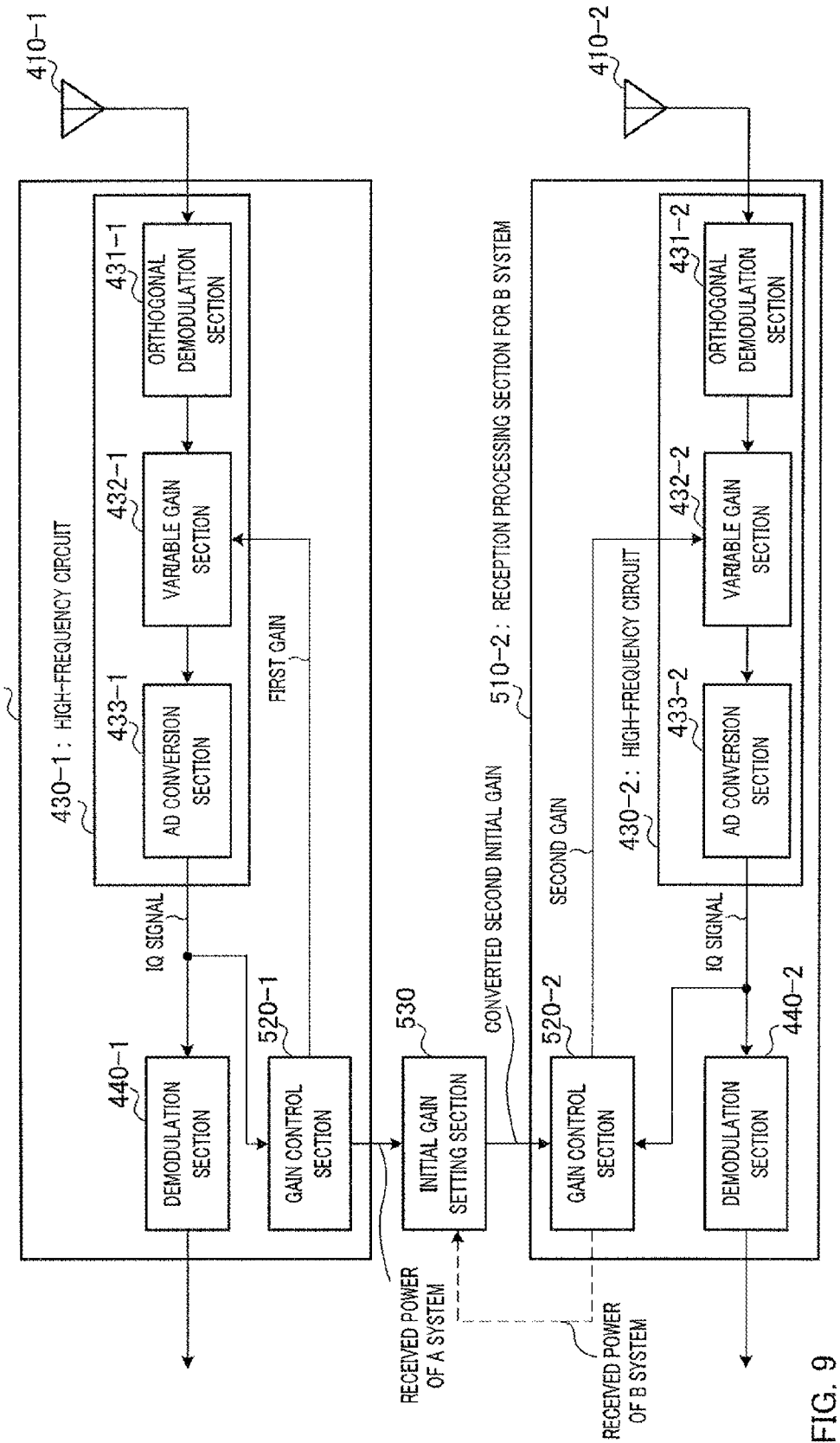
FIG. 9 is a block diagram illustrating the configuration of the wireless device according to Embodiment 2 of the present invention.

FIG. 9 is a block diagram illustrating the configuration of the wireless device according to the present embodiment. Wireless device 500 of FIG. 9 is applied to wireless device #1 (200) of FIG. 1. In FIG. 9, components common to FIG. 2 are assigned the same reference numerals as FIG. 2, and descriptions thereof will be omitted. In contrast to wireless device 400 of FIG. 2, wireless device 500 of FIG. 9 includes reception processing section for the "A system" 510-1, and reception processing section for the "B system" 510-2, instead of reception processing section for the "A system" 420-1, and reception processing section for the "B system" 420-2. In contrast to wireless device 400 of FIG. 2, wireless device 500 of FIG. 9 also includes initial gain setting section 530 instead of initial gain setting section 460.

In contrast to reception processing section for the "A system" 420-1, reception processing section for the "A system" 510-1 includes gain control section 520-1 instead of gain control section 450-1.

Gain control section 520-1 adjusts the gain of variable gain section 432-1 (that is, the first gain) while monitoring the power of the digital IQ signal of the "A system," similarly to gain control section 450-1. Gain control section 520-1 further estimates received power of the signal of the "A system" at the end of antenna 410-1 (hereinafter also referred to as "received power of the 'A system'"), based on the digital IQ signal of the "A system" and the information on the final first gain. Gain control section 520-1 then outputs information on the received power of the "A system," to initial gain setting section 530. The internal configuration and operations of gain control section 520-1 will be described later.

Initial gain setting section 530 sets the initial gain of variable gain section 432-2 (that is, the converted second initial gain), based on the received power of the "A system" during communication. The method of setting the converted second initial gain will be described later.

In contrast to reception processing section for the "B system" 420-2, reception processing section for the "B system" 510-2 includes gain control section 520-2 instead of gain control section 450-2.

Gain control section 520-2 adjusts the gain of variable gain section 432-2 (the second gain) while monitoring the power of the digital IQ signal of the "B system". Specifically, gain control section 520-2 uses the converted second initial gain set by initial gain setting section 530, as the initial gain at the start of the gain adjustment during wireless communication using the "B system". Gain control section 520-2 then sets the second gain such that the power of the digital IQ signal of the "B system" remains constant. The internal configuration and operations of gain control section 520-2 will be described later.

Figure 10:
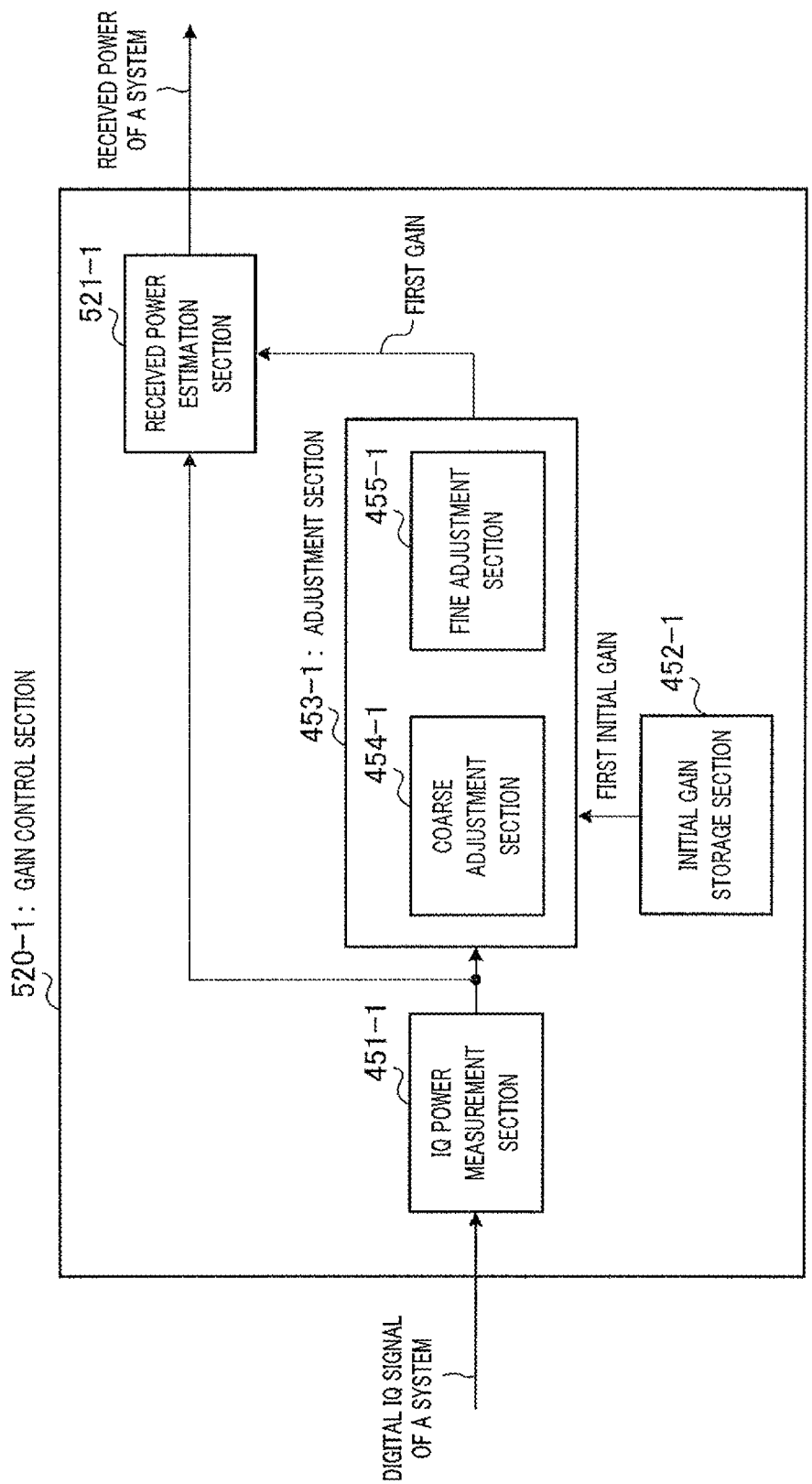
FIG. 10 is a diagram illustrating an example of the internal configuration of the gain control section in the reception processing section for the "A system" according to Embodiment 2.

FIG. 10 is a diagram illustrating an example of the internal configuration of gain control section 520-1 in reception processing section for the "A system" 510-1. In FIG. 10, components common to FIG. 3 are assigned the same reference numerals as FIG. 3, and detailed descriptions thereof will be omitted.

Gain control section 520-1 includes IQ power measurement section 451-1, initial gain storage section 452-1, adjustment section 453-1, and received power estimation section 521-1.

IQ power measurement section 451-1 measures the power value of the digital IQ signal of the "A system", and outputs the measured power value to adjustment section 453-1 and received power estimation section 521-1.

Adjustment section 453-1 sets the final first gain while adjusting the first gain in coarse adjustment section 454-1 and fine adjustment section 455-1. Adjustment section 453-1 outputs the information on the set final first gain to received power estimation section 521-1.

Received power estimation section 521-1 estimates the received power of the signal of the "A system" at the end of antenna 410-1 (that is, the received power of the "A system"), based on the power value of the digital IQ signal of the "A system" and the information on the final first gain. Received power estimation section 521-1 then outputs the information on the received power of the "A system," to initial gain setting section 530.

Figure 11:
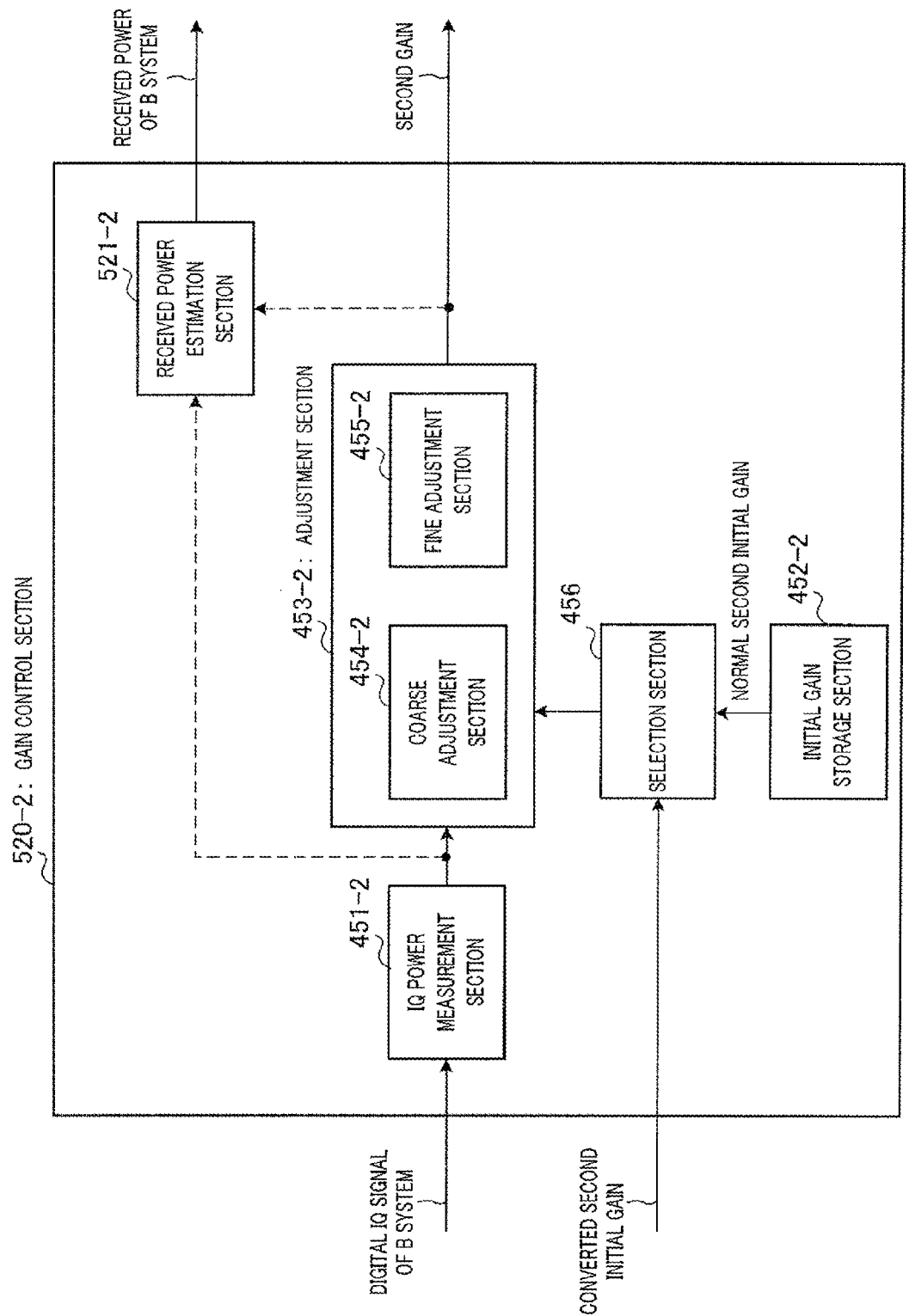
FIG. 11 is a diagram illustrating an example of the internal configuration of the gain control section in the reception processing section for the "B system" according to Embodiment 2.

FIG. 11 is a diagram illustrating an example of the internal configuration of gain control section 520-2 in reception processing section for the "B system" 510-2. In FIG. 11, components common to FIG. 4 are assigned the same reference numerals as FIG. 4, and detailed descriptions thereof will be omitted.

Gain control section 520-2 includes IQ power measurement section 451-2, initial gain storage section 452-2, adjustment section 453-2, selection section 456, and received power estimation section 521-2. Received power estimation section 521-2 does not operate in the actual communication, but operates only at the time of preadjustment (that is, prior to actual communication).

IQ power measurement section 451-2 measures the power value of the digital IQ signal of the "B system," and outputs the measured power value to adjustment section 453-2. IQ power measurement section 451-2 outputs the measured power value to adjustment section 453-2 and received power estimation section 521-2 only at the time of the preadjustment.

Adjustment section 453-2 sets the final second gain of variable gain section 432-2 while adjusting the second gain.

Received power estimation section 521-2 estimates received power of the signal of the "B system" at the end of antenna 410-2 (that is, the received power of the "B system"), based on the power value of the digital IQ signal of the "B system" and the information on the second gain, at the time of the preadjustment. Received power estimation section 521-2 then outputs the information on the received power of the "B system," to initial gain setting section 530.

The method of setting the converted second initial gain in initial gain setting section 530 will be described next.

[Setting Method #2-1]

Received power estimation sections 521-1 and 521-2 estimate the received power of the signals of the A and B systems, at the time of the preadjustment, in two cases of a long distance between wireless device 500 (that is, wireless device #1) and transmitter wireless device #2, and of a short distance therebetween.

Initial gain setting section 530 stores the following information (P1, Q1, P2, Q2) into an internal memory:

P1: A difference between the transmitted power and the received power of the signal of the "A system" in the case of the long distance between wireless device #1 and wireless device #2.

Q1: A difference between the transmitted power and the received power of the signal of the "B system" in the case of the long distance between wireless device #1 and wireless device #2.

P2: The difference between the transmitted power and the received power of the signal of the "A system" in the case of the short distance between wireless device #1 and wireless device #2.

Q2: The difference between the transmitted power and the received power of the signal of the "B system" in the case of the short distance between wireless device #1 and wireless device #2.

The information on the received power of the signal of the "A system" is input to initial gain setting section 530 during communication. Initial gain setting section 530 then calculates a difference P3 between the transmitted power and this received power of the signal of the "A system".

Initial gain setting section 530 then estimates a difference Q3 between the transmitted power and the received power of the signal of the "B system," based on the difference P3 between the transmitted power and this received power of the signal of the "A system".

Specifically, assuming that the difference between the transmitted power and the received power has linearity, initial gain setting section 530 estimates the difference Q3 between the transmitted power and the received power of the signal of the "B system".

Figure 12:
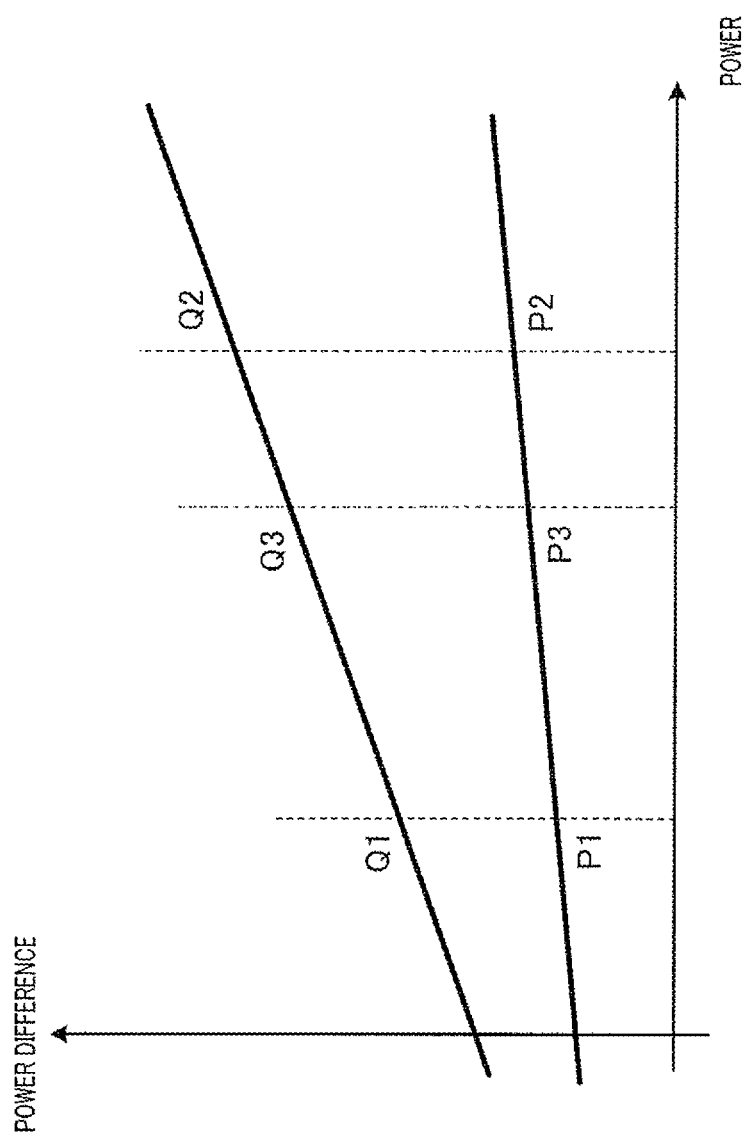
FIG. 12 is a diagram illustrating a relationship among the differences P1, Q1, P2, Q2, P3 and Q3.

FIG. 12 is a diagram illustrating a relationship among the differences P1, Q1, P2, Q2, P3 and Q3. As illustrated in FIG. 12, initial gain setting section 530 estimates the difference Q3 by using Equations 1 and 2, according to a relationship between the differences P1, Q1, P2 and Q2 previously obtained at the time of the preadjustment, and the difference P3 obtained during communication.

$$(Q3-Q1)=(Q2-Q1)(P3-P1)/(P2-P1) \quad \text{(Equation 1)}$$

$$Q3=(Q2-Q1)(P3-P1)/(P2-P1)+Q1 \quad \text{(Equation 2)}$$

The difference Q3 indicates an estimated value of the propagation loss of the signal of the "B system" through the propagation path.

Initial gain setting section 530 then sets the initial gain of variable gain section 432-2 (that is, the converted second initial gain) depending on the difference Q3.

In Setting Method #2-1, initial gain setting section 530 thus previously obtains association between a difference PA between the transmitted power and the received power of the signal of the "A system," and a difference PB between the transmitted power and the received power of the signal of the "B system". Initial gain setting section 530 then estimates the difference Q3 based on this association and the difference P3. Here, the difference P3 is a difference between the transmitted power of one signal of the "A system" and the received power of the signal of the "A system" that has been estimated by received power estimation section 521-1. The difference Q3 is the difference between the transmitted power and the received power of the signal of the "B system". Initial gain setting section 530 then sets the converted second initial gain based on the estimated difference Q3. Initial gain setting section 530 thus sets the gain suitable for compensating for the propagation loss of the signal of the "B system," to the converted second initial gain, from the received power of the "A system". Gain control section 520-2 can thereby reduce the time required for the gain adjustment.

[Setting Method #2-2]

In Setting Method #2-1, initial gain setting section 530 used Equation (2) to estimate the received power of the signal of the "B system," from the received power of the signal of the "A system". In Setting Method #2-2, instead of Equation (2), initial gain setting section 530 sets the converted second initial gain by using an association table of PA and PB, where the difference PA between the transmitted power and the received power of the signal of the "A system," is associated with the corresponding difference PB between the transmitted power and the received power of the signal of the "B system,".

Received power estimation sections 521-1 and 521-2 estimate the received power of the signals of the A and B systems, at multiple distances between wireless device 500 (that is, wireless device #1) and transmitter wireless device #2, at the time of the preadjustment.

Initial gain setting section 530 stores a table including the difference PA associated with the difference PB at each of the multiple distances between wireless device 500 (wireless device #1) and transmitter wireless device #2, into the internal memory. Here, the difference PA is the difference between the transmitted power and the received power of the signal of the "A system". The difference PB is the difference between the transmitted power and the received power of the signal of the "B system".

FIG. 13 is a diagram illustrating an example of the table stored in initial gain setting section 530. Initial gain setting section 530 stores the table including the difference PA associated with the corresponding difference PB at each distance.

The information on the received power of the signal of the "A system" is input to initial gain setting section 530 in the actual communication. Initial gain setting section 530 then calculates the difference P3 between the transmitted power and this received power of the signal of the "A system".

Initial gain setting section 530 then estimates the difference Q3 between the transmitted power and the received power of the signal of the "B system," based on the difference P3 between the transmitted power and this received power of the signal of the "A system," with reference to the above table.

Subsequently, initial gain setting section 530 sets the converted second initial gain of variable gain section 432-2, depending on the difference Q3, similar to Setting Method #2-1.

In Setting Method #2-2, initial gain setting section 530 stores the table including the difference PA associated with the corresponding difference PB. Initial gain setting section 530 then sets the converted second initial gain, based on the difference PB associated with the difference between the transmitted power of the signal of the "A system" and the received power of the signal of the "A system" that has been estimated by received power estimation section 521-1.

Initial gain setting section 530 thus sets the gain suitable for compensating for the propagation loss of the signal of the "B system", to the converted second initial gain, from the received power of the "A system". Gain control section 520-2 thereby reduces the time required for the gain adjustment.

[Setting Method #2-3]

Initial gain setting section 530 determines the electric field level of the propagation path, from the received power of the signal of the "A system". Initial gain setting section 530 then sets the converted second initial gain of variable gain section 432-2 depending on the determined electric field level.

Initial gain setting section 530, for example, compares the received power of the signal of the "A system" with the twenty-first range (from 43 dB to 63 dB), the twenty-second range (from 21 dB to 42 dB), and the twenty-third range (from 0 dB to 20 dB). The received power of the signal of the "A system," for example, is assumed to be in the twenty-first range (from 43 dB to 63 dB), in the twenty-second range (from 21 dB to 42 dB), or in the twenty-third range (from 0 dB to 20 dB). In this case, initial gain setting section 530 is assumed to determine the electric field level to be the strong electric field level, the medium electric field level, or the weak electric field level, respectively.

Now, the received power of the signal of the "A system" is assumed to be 38 dB. In this case, initial gain setting section 530 determines that the electric field level of the propagation path is the medium electric field level, from the received power of the signal of the "A system" (=38 dB).

After determining the electric field level from the received power of the signal of the "A system," initial gain setting section 530 then sets the initial gain of coarse adjustment section 454-2 depending on a result of the determination.

A method of setting the initial gain of coarse adjustment section 454-2 is similar to Setting Method #1-3, and thus a description thereof will be omitted.

In Setting Method #2-3, initial gain setting section 530 thus classifies the status of the propagation path into the strong electric field level, the medium electric field level, or the weak electric field level, based on the received power of the signal of the "A system". Initial gain setting section 530 then sets the initial gain of variable gain section 432-2 (that is, the converted second initial gain) depending on the status of the propagation path. The received power of the signal of the "A system" includes the information on the propagation loss as described above. Initial gain setting section 530 then determines the status of the propagation path depending on the received power of the signal of the "A system," and sets the converted second initial gain suitable for the status of the propagation path. Accordingly, gain control section 520-2 starts the gain adjustment with the converted second initial gain suitable for compensating for the propagation loss. Gain control section 520-2 thereby reduces the time required for the gain adjustment. Since Setting Method #2-3 does not need the estimation of the received power of the signal of the "B system" during communication and at the time of the preadjustment, gain control section 520-2 can employ a configuration without received power estimation section 521-2.

[Setting Method #2-4]

In Setting Method #2-4, initial gain setting section 530 stores a table including the difference PA associated with the corresponding second gain, and sets the initial gain of variable gain section 432-2 (that is, the converted second initial gain) based on the difference PA.

FIG. 14 is a diagram illustrating an example of the table stored in initial gain setting section 530. The difference PA is associated with the corresponding second gain based on the effects of the propagation losses through the propagation path and due to the difference between the frequencies of the signals of the A and B systems. In other words, this table includes the difference PA associated with the corresponding second gain required for compensating for the difference PB obtained by applying the frequency characteristic conversion to the difference PA, depending on the difference between the propagation losses of the signals of the A and B systems.

Initial gain setting section 530 then selects the second gain associated with the difference PA, from this table, and sets the selected second gain to the initial gain of variable gain section 432-2 (that is, the converted second initial gain).

In Setting Method #2-4, initial gain setting section 530 thus stores the table including the difference PA associated with the corresponding second gain, depending on the propagation losses of the signals of the A and B systems through the propagation path. Initial gain setting section 530 then sets the second gain associated with the corresponding difference P3 between the transmitted power of the signal of the "A system" and the received power of the signal of the "A system" that has been estimated by received power estimation section 521-1, to the converted second initial gain. Accordingly, gain control section 520-2 starts the gain adjustment with the converted second initial gain suitable for compensating for the propagation loss. Gain control section 520-2 thereby reduces the time required for the gain adjustment, since Setting Method #2-4 does not need the estimation of the received power of the signal of the "B system" during communication and at the time of the preadjustment. Gain control section 520-2 therefore employs a configuration without received power estimation section 521-2.

As described above, in wireless device 500 according to the present embodiment, initial gain setting section 530 sets the converted second initial gain based on the received power of the signal of the "A system". Gain control section 520-2 then sets this converted second initial gain to the second gain at the start of the gain adjustment, and adjusts the second gain based on the IQ signal of the "B system" whose level has been adjusted by variable gain section 432-2. Wireless device 500 thereby starts the gain adjustment with the converted second initial gain suitable for compensating for the propagation loss, and reduces the time required for the gain adjustment. In other words, wireless device 500 reduces the time required for AGC processing. Wireless device 500 therefore improves the communication performance according to an increase in the time available for the AFC process and the timing synchronization process in the preamble period.

After the converted second initial gain is set, only fine adjustment section 455-2 may perform the gain adjustment, without coarse adjustment section 454-2. The present embodiment thereby reduces the power consumption in the subsequent gain adjustment without coarse adjustment section 454-2.

The entire content of the disclosure of the description, drawings and abstract included in Japanese Patent Application No. 2011-048965 filed on Mar. 7, 2011 is incorporated herein by reference.

Industrial Applicability

The wireless device and the reception method according to the present invention are useful for wireless devices capable of multiple wireless schemes and the like.

Reference Signs List

100 Wireless system
200, 300, 400, 500 Wireless device
210, 310 Processing section for the A system
220, 320 Processing section for the B system 410-1, 410-2 Antenna
420-1, 510-1 Reception processing section for the A system
420-2, 510-2 Reception processing section for the B system
430-1, 430-2 High-frequency circuit
431-1, 431-2 Orthogonal demodulation section
432-1, 432-2 Variable gain section
433-1, 433-2 AD conversion section
440-1, 440-2 Demodulation section
450-1, 450-2, 520-1, 520-2 Gain control section
451-1, 451-2 IQ power measurement section
452-1, 452-2 Initial gain storage section
453-1, 453-2 Adjustment section
454-1, 454-2 Coarse adjustment section
455-1, 455-2 Fine adjustment section
456 Selection section
460, 530 Initial gain setting section
521-1, 521-2 Received power estimation section

The invention claimed is:

1. A wireless device, comprising:
a first antenna that receives a first signal modulated by a first wireless scheme;
a second antenna that receives a second signal modulated by a second wireless scheme;
a first variable gain section that adjusts a level of the first signal;
a second variable gain section that adjusts a level of the second signal;
a first gain control section that adjusts a first gain based on the first signal whose level has been adjusted by the first variable gain section, the first gain being a gain of the first variable gain section;
a setting section that sets an initial gain based on the first signal, the initial gain being a second gain that is a gain of the second variable gain section, the initial gain being used by the second variable gain section at start of gain adjustment; and
a second gain control section that sets the initial gain to the second gain at the start of the gain adjustment, and adjusts the second gain based on the second signal whose level has been adjusted by the second variable gain section.

2. The wireless device according to claim 1, wherein
the setting section sets the initial gain based on the adjusted first gain.

3. The wireless device according to claim 2, wherein
the setting section sets the adjusted first gain to the initial gain.

4. The wireless device according to claim 2, wherein
the second variable gain section includes a first gain section that coarsely adjusts the level, and a second gain section that finely adjusts the level within a gain adjustment range smaller than a gain adjustment range in the first gain section, and
the setting section sets the initial gain to be used by the first gain section, based on the adjusted first gain.

5. The wireless device according to claim 2, wherein
the setting section compares the first gain with a predetermined range, and selects and sets the initial gain from multiple candidates based on a result of the comparison.

6. The wireless device according to claim 2, wherein
the setting section stores a table including the first gain associated with the second gain depending on propagation losses of the first signal and the second signal through a propagation path, and sets the second gain associated with the adjusted first gain, to the initial gain.

7. The wireless device according to claim 1, further comprising:
an estimation section that uses the first signal whose level has been adjusted by the first variable gain section, and the first gain to estimate received power of the first signal received by the first antenna,
wherein the setting section sets the initial gain based on the received power of the first signal that has been estimated by the estimation section.

8. The wireless device according to claim 7, wherein
the setting section previously obtains association between a first difference that is a difference between transmitted power of the first signal and the received power of the first signal, and a second difference that is a difference between transmitted power of the second signal and received power of the second signal; estimates the second difference based on the association and a difference between the transmitted power of the first signal and the received power of the first signal that has been estimated by the estimation section; and sets the initial gain based on the estimated second difference.

9. The wireless device according to claim 8, wherein
the setting section stores a table including the first difference associated with the second difference, and sets the initial gain based on the second difference associated with the difference between the transmitted power of the first signal and the received power of the first signal that has been estimated by the estimation section.

10. The wireless device according to claim 7, wherein
the setting section compares the received power of the first signal that has been estimated by the estimation section, with a predetermined range, and selects and sets the initial gain from multiple candidates based on a result of the comparison.

11. The wireless device according to claim 7, wherein
the setting section stores a table including the first difference associated with the second gain depending on propagation losses of the first signal and the second signal through a propagation path, and sets the second gain associated with a difference between transmitted power of the first signal and the received power of the first signal that has been estimated by the estimation section, to the initial gain.

12. A reception method, comprising:
a first receiving step of receiving a first signal modulated by a first wireless scheme;
a second receiving step of receiving a second signal modulated by a second wireless scheme;
a first adjustment step of adjusting a level of the first signal;
a second adjustment step of adjusting a level of the second signal;
a first gain control step of adjusting a first gain based on the first signal whose level has been adjusted by the first adjustment step, the first gain being a gain in the first adjustment step;
a setting step of setting an initial gain for a second gain based on the first signal, the second gain being a gain in the second adjustment step, the initial gain being used by the second adjustment step at start of gain adjustment; and
a second gain control step of setting the initial gain to the second gain at the start of the gain adjustment, and adjusting the second gain based on the second signal whose level has been adjusted by the second adjustment step.

* * * * *